United States Patent
Kiihamäki et al.

(10) Patent No.: US 7,882,741 B2
(45) Date of Patent: Feb. 8, 2011

(54) METHOD FOR MANUFACTURING MICROMECHANICAL COMPONENTS

(75) Inventors: Jyrki Kiihamäki, Helsinki (FI); Hannu Kattelus, Vantaa (FI)

(73) Assignee: Valtion Teknillinen Tutkimuskeskus, Espoo (FI)

( * ) Notice: Subject to any disclaimer, the term of this patent is extended or adjusted under 35 U.S.C. 154(b) by 183 days.

(21) Appl. No.: 11/920,687

(22) PCT Filed: Jun. 2, 2006

(86) PCT No.: PCT/FI2006/000174
§ 371 (c)(1),
(2), (4) Date: Feb. 25, 2008

(87) PCT Pub. No.: WO2006/128958
PCT Pub. Date: Dec. 7, 2006

(65) Prior Publication Data
US 2009/0206423 A1     Aug. 20, 2009

(30) Foreign Application Priority Data
Jun. 3, 2005     (FI) .................... 20050592

(51) Int. Cl.
*G01P 15/125* (2006.01)
(52) U.S. Cl. .................... 73/514.32; 361/280
(58) Field of Classification Search .............. 73/514.32, 73/514.18, 514, 24; 361/280
See application file for complete search history.

(56) References Cited

U.S. PATENT DOCUMENTS

| | | | |
|---|---|---|---|
| 5,563,343 A * | 10/1996 | Shaw et al. .............. | 73/514.18 |
| 5,756,901 A | 5/1998 | Kurle et al. | |
| 5,804,084 A | 9/1998 | Nasby et al. | |
| 5,959,208 A * | 9/1999 | Muenzel et al. .......... | 73/514.32 |
| 5,987,989 A * | 11/1999 | Yamamoto et al. ....... | 73/514.24 |
| 6,148,670 A | 11/2000 | Judy | |
| 6,393,913 B1 | 5/2002 | Dyck et al. | |
| 2002/0059829 A1 | 5/2002 | Sakai | |
| 2003/0172753 A1 | 9/2003 | Geen | |
| 2004/0121506 A1 | 6/2004 | Gogoi | |

(Continued)

FOREIGN PATENT DOCUMENTS

EP     0 822 415 A1     2/1998

OTHER PUBLICATIONS

Kaajakari et al., "Square—Extentional Mode Single—Crystal Silicon Micromechanical Resonator for Low—Phase—Noise Oscillator Applications", vol. 25, No. 4, Apr. 2004, pp. 173-175.

(Continued)

*Primary Examiner*—John E Chapman
(74) *Attorney, Agent, or Firm*—Birch, Stewart, Kolasch & Birch, LLP

(57) ABSTRACT

The present invention relates to a method for manufacturing an acceleration sensor. In the method, thin SOI-wafer structures are used, in which grooves are etched, the walls of which are oxidized. A thick layer of electrode material, covering all other material, is grown on top of the structures, after which the surface is ground and polished chemo-mechanically, thin release holes are etched in the structure, structural patterns are formed, and finally etching using a hydrofluoric acid solution is performed to release the structures intended to move and to open a capacitive gap.

13 Claims, 4 Drawing Sheets

U.S. PATENT DOCUMENTS

2005/0097957 A1    5/2005    McNeil et al.

OTHER PUBLICATIONS

Pourkamali S et al., Transducers, Solid-state Sensors, Actuators and Microsystems, 12 Innational Conference on, 2003, vol. 1, Jun. 9, 2003, pp. 837-840.

Wan-Thai Hsu et al., Proceedings of the IEEE, 14th. Annual International Conference on Microelectro Mechanical Systems. Mems 2001. Jan. 21-25, 2001, IEEE International Micro electro Mechanical Systems Conference, vol. Conf. 14 Jan. 21, 2001, pp. 349-352.

Quevy E et al., Proceedings of the IEEE 16th. Annual International Conference on Microelecto Mechanical Systems. Mems 2003, IEEE vol. Conf. 16, Jan. 19, 2003, pp. 157-160.

\* cited by examiner

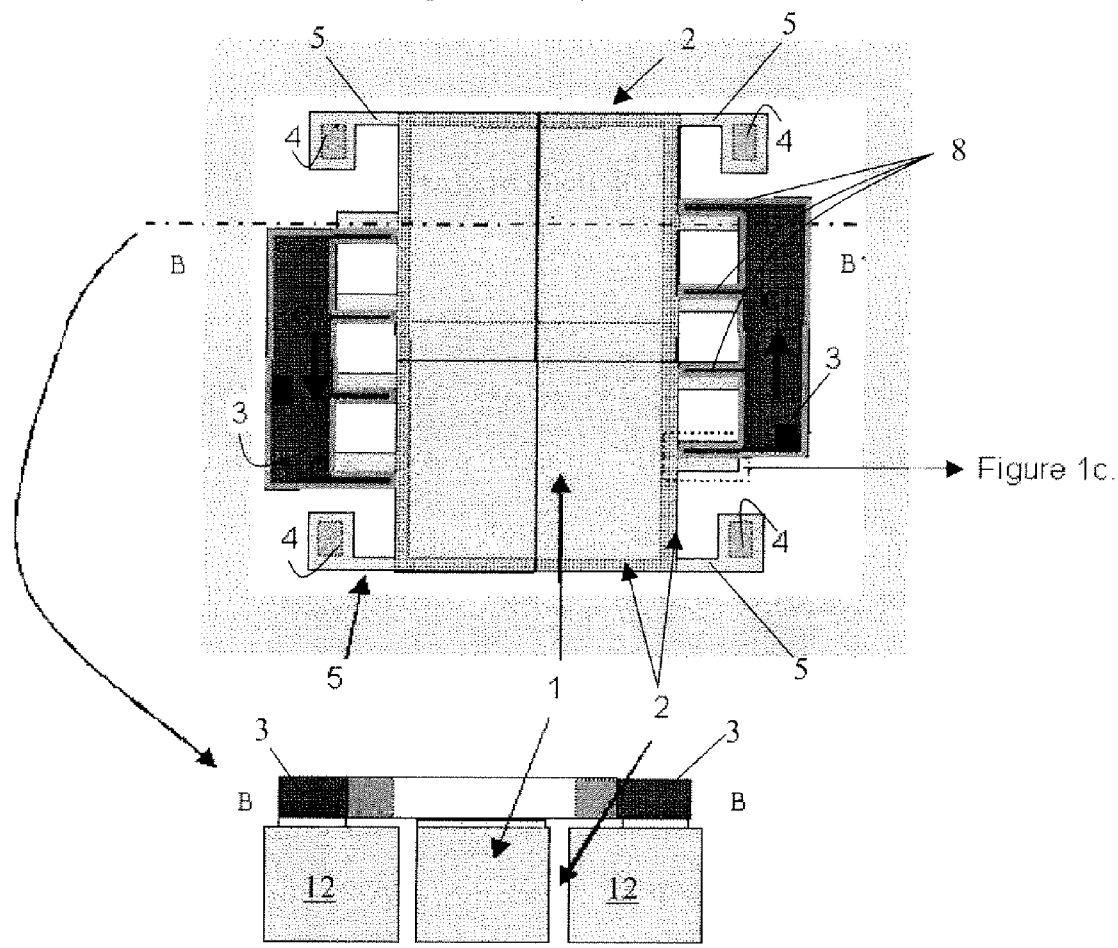

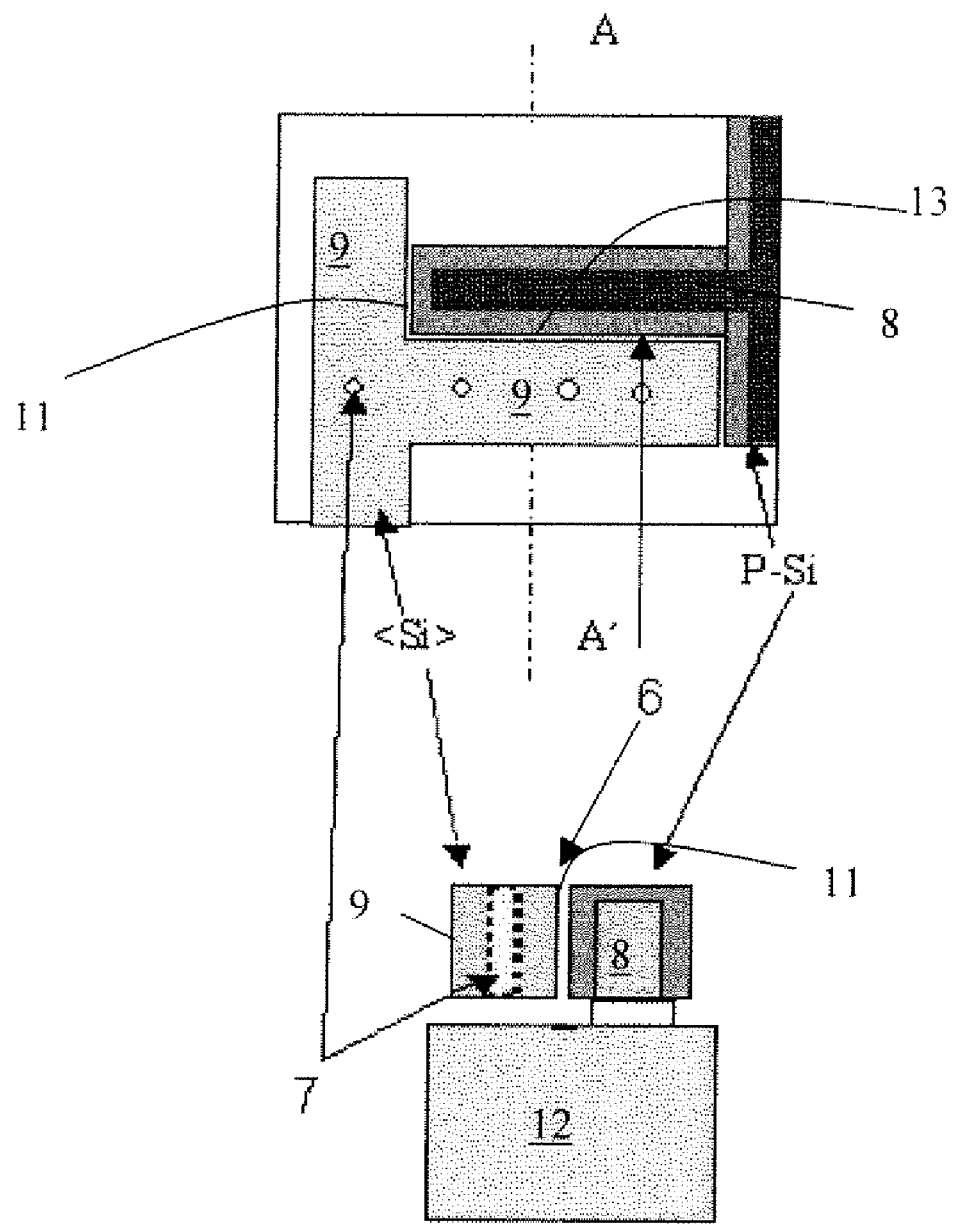
Figure 1c. Detail of protrusions
Figure 1d. Cross-section A' - A

METHOD FOR MANUFACTURING MICROMECHANICAL COMPONENTS

The present invention relates to a method for implementing narrow gaps in micromechanical components, in a micromechanical SOI-wafer structure.

The invention also relates to a silicon micromechanical structure and the use of a silicon micromechanical structure.

In the method according to the prior art, silicon-micromechanical devices, such as acceleration sensors and other similar devices, are mainly manufactured by using SOI (silicon-on-insulator) wafer structures, on which grooves are etched, the walls of which are oxidized and the surface of which is then planarized by fluorine-plasma etching.

In a publication by Hsu et al. [W.-T. Hsu, J. R. Clark, and C. T.-C Nguyen, 'A sub-micron capacitive gap process for multiple-metal-electrode lateral micromechanical resonators'. *Proc. IEE MEMS Conference*, (Interlaken Switzerland, 2001), p. 349] a method is disclosed for forming horizontal capacitive gaps between a micromechanical structure and its metal electrodes, in which method membranes of oxide and LPCVD silicon nitride are grown, which layers insulate the devices and the connector units from an electrically conductive silicon substrate, after which a layer of junction-polysilicon is formed, which is doped and on which structural patterns are formed. An oxide layer is again formed on top of the structural patterns, which acts as a sacrificing layer in later plasma etching. After forming vias, a layer of structural polysilicon is formed, which is doped and heat-treated. The final structure is achieved by plasma etching. According to the method of the publication, the electrodes in the finished structure are metal, whereas the moving parts are polysilicon.

Vertical capacitive gaps too have been formed on an SOI substrate [S. Pourkamali and F. Ayazi, 'SOI-Based HF and VHF Single-Crystal Silicon Resonators with Sub-100 Nanometer Vertical Capacitive Gaps,' *Digest of the 12th International Conference on Solid State Sensors, Actuators and Microsystems (Transducers '03)*, Boston, Jun. 8-12, 2003, pp. 837-840], using a method that corresponds to that disclosed in Hsu et al.'s publication. As in the previous publication, in the method of this publication too the final structure is achieved using plasma etching. In the structures presented in the publication, the electrodes are of polysilicon while the moving parts are of single-crystal silicon.

Quey et al. have shown in a publication (E. Quevy, B. Legrand, D Collard, L. Buchaillot, 'Ultimate Technology for Micromachining of Nanometric Gap HF Micromechanical Resonators'. 16th IEEE Micro Electro Mechanical System, Kyoto, Japan, 2003) that horizontal capacitive gaps can be made as narrow as 60 nm. According to the publication in question, two materials are used in the moving parts, i.e. single-crystal silicon and LPCVD polysilicon typically grown from disilane. Strongly doped polysilicon was used as the material of the electrodes.

A manufacturing method for a micromechanical resonator is disclosed in a publication by Kaajakari et al. (Ville Kaajakari, Tomi Mattila, Aarne Oja, Jyrki Kiihamäki, and Heikki Seppä, Square-Extensional Mode Single-Crystal Silicon Micromechanical Resonator for Low-Phase-Noise Oscillator Applications, *IEEE Electron Device Letters*, Vol. 25, No. 4, 2004).

Even though structures, which have an even topography and in which there are even narrow capacitive gaps, have been created with the aid of the prior art, these solutions have, however, the drawback that the surface of the structures remains rough from using plasma etching, whereby the structures in question cannot be closely attached to other structures, as air and particles can enter the interior parts of the structures.

In addition, a so-called planarizing resistance must be used in planar etching. The thickness of this resistance, together with the thickness of the LPCVD polysilicon, limits the thickness of the available structural layer.

There is a need for a method, by means of which structures with even, smooth surfaces can be created, which can be tightly connected to other similar structures and to the walls of devices, using a manner of evening the surfaces, which will not limit the thickness of the structural layer.

The present invention is intended to provide an improved method for manufacturing silicon-micromechanical structures, such as resonators, acceleration sensors, and other similar devices. By means of a preferred embodiment of the invention, grinding and polishing can be used to create structures with smooth surfaces.

By means of the present invention, micromechanical components for implementing narrow gaps are manufactured from SOI-wafer structures, in which structures grooves are etched, the walls of which are oxidized. According to the method:

a) a thick layer of an electrode material is grown, which layer covers all other material,
b) the surface is smoothed by grinding,
c) the silicon is polished using chemo-mechanical polishing, whereby the height of the surface is also returned to its original level,
d) release holes are etched into the structure,
e) structural patterns are created, and
f) etching using hydrofluoric acid is performed to release the structures intended to move.

More specifically, the method according to the invention implements narrow gaps in micromechanical components from a micromechanical SOI-wafer structure, in which grooves are etched, the walls of which are oxidized, the method comprising a) growing a thick layer of electrode material (14) on the wafer structure, which layer covers all other material, b) evening the surface by grinding, c) polishing the surface by chemo-mechanical polishing, d) etching thin release holes (7) into the structure, e) forming structural patterns (1, 8, 9), and f) etching with a hydrofluoric acid solution to release the structures (1, 8, 9).

The silicon-micromechanical structure according to the present invention is a structure which comprises a body (12), a mass (1) attached flexibly to the body (12), a capacitor structure (8, 9) formed between the body (12) and the mass (1), wherein protrusions (8, 9) corresponding to each other and facing each other are formed in both the mass (1) and the body (12), in order to create the greatest possible capacitive density.

The silicon-micromechanical structure according to the invention can be used, for example, in vacuum-sealing or packaging, or in applications, in which a large capacitance is required between the electrodes.

The method according to the invention differs from the prior art particularly in the stage of smoothing the surface, in which, in the method of the present invention, plasma etching as in the reference publications is not used, but instead mechanical grinding and chemo-mechanical polishing.

In a preferable embodiment of the present invention, also a comb-like electrode structure can be formed.

An advantage of the method of one embodiment of the invention is that with the aid of grinding and polishing a very even and smooth surface is presented, which on the other hand makes it possible to manufacture e.g. air tight structures and devices using different wafer-bonding techniques.

An advantage of a second embodiment of the method is that it is also suitable for use with a greater structural thickness than that in methods according to the prior art, because in it there is no need of a planarizing resistance that limits thickness.

Using an embodiment of the present invention, in which the surface is first smoothed mechanically by grinding and then polished using chemo-mechanical polishing (CMP), the structure is made more even and smooth than by means of the plasma etching used in the prior art.

Other details and advantages of the invention will become apparent from the following detailed description.

FIG. 1a is a detailed view of a 1-D acceleration sensor according to one preferred embodiment of the invention. The view from above provides a general view of the entire structure.

FIG. 1b is a cross-section (B-B') of the structure in FIG. 1a.

FIG. 1c is a close-up view of the protrusion structure.

FIG. 1d is a cross-section (A'-A) of the protrusion structure.

FIG. 3a shows a top view of a flat resonator according to a preferred embodiment of the invention.

FIG. 3b is a cross-section of one alternative solution to the structure in FIG. 3a.

FIG. 3c is a cross-section of a preferred embodiment of the structure in FIG. 3a.

Figure 2:
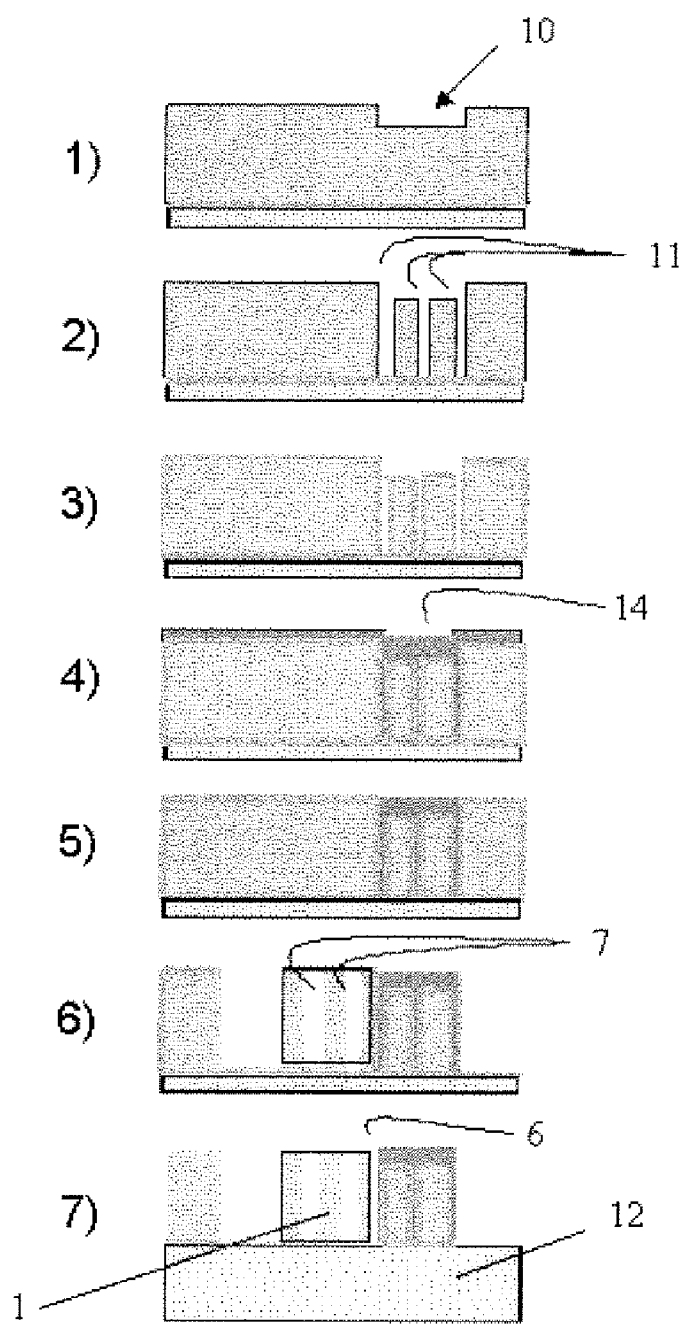
FIG. 2 shows the manufacturing method of the silicon-micromechanical components.

The following numbering is used in the figures:
1 floating mass of single-crystal silicon
2 groove travelling through the substrate
3 electrodes
4 anchor
5 suspension spring
6 narrow gap
7 hole for release etching
8 protrusion structure of electrodes
9 protrusion structure of single-crystal silicon
10 recess in the SOI-wafer structure
11 longitudinal groove between the protrusion structures
12 substrate
13 transverse groove between the protrusion structures
14 electrode material In FIG. 1, a moving structure 1 made of single-crystal silicon 'floats' on four anchors 4, to which it is attached with the aid of suspension springs 5. A groove 2, which ensures the movability of the structure by keeping its moving structure 1 separate from the substrate 12, runs around the moving structure 1. Extra holes 7 are also made in the single-crystal silicon for the release etching. In the single-crystal silicon there are at least two protrusions 9 while opposite to them are set a corresponding number of electrode protrusions 8. A narrow gap 6, which consists of longitudinal grooves 11 and transverse grooves 13, and which forms the air gap of the junction capacitor formed by the protrusions 8, 9, is etched between the protrusions 9 of the single-crystal silicon and the protrusions 8 of the electrodes. The protrusions give the electrode structure a comb-like appearance when viewed from above.

FIG. 2 shows the various stages (Stages 1-7) of the manufacturing method of the comb-like electrode structures advantageously formed in the silicon-micromechanical components:
1) a recess 10 is etched into the SOI-wafer structure,
2) both longitudinal 11 and transverse 13 grooves are etched into the wafer at the location of the recess 10,
3) the walls of the grooves 11, 13 are oxidized,
4) a thick layer of electrode material 14 is grown on the entire structure,
5) the surface is evened by grinding and chemo-mechanical polishing,
6) structural patterns and release holes 7 are formed, and
7) etching with a hydrofluoric acid solution is performed to release the structures.

Figure 3:
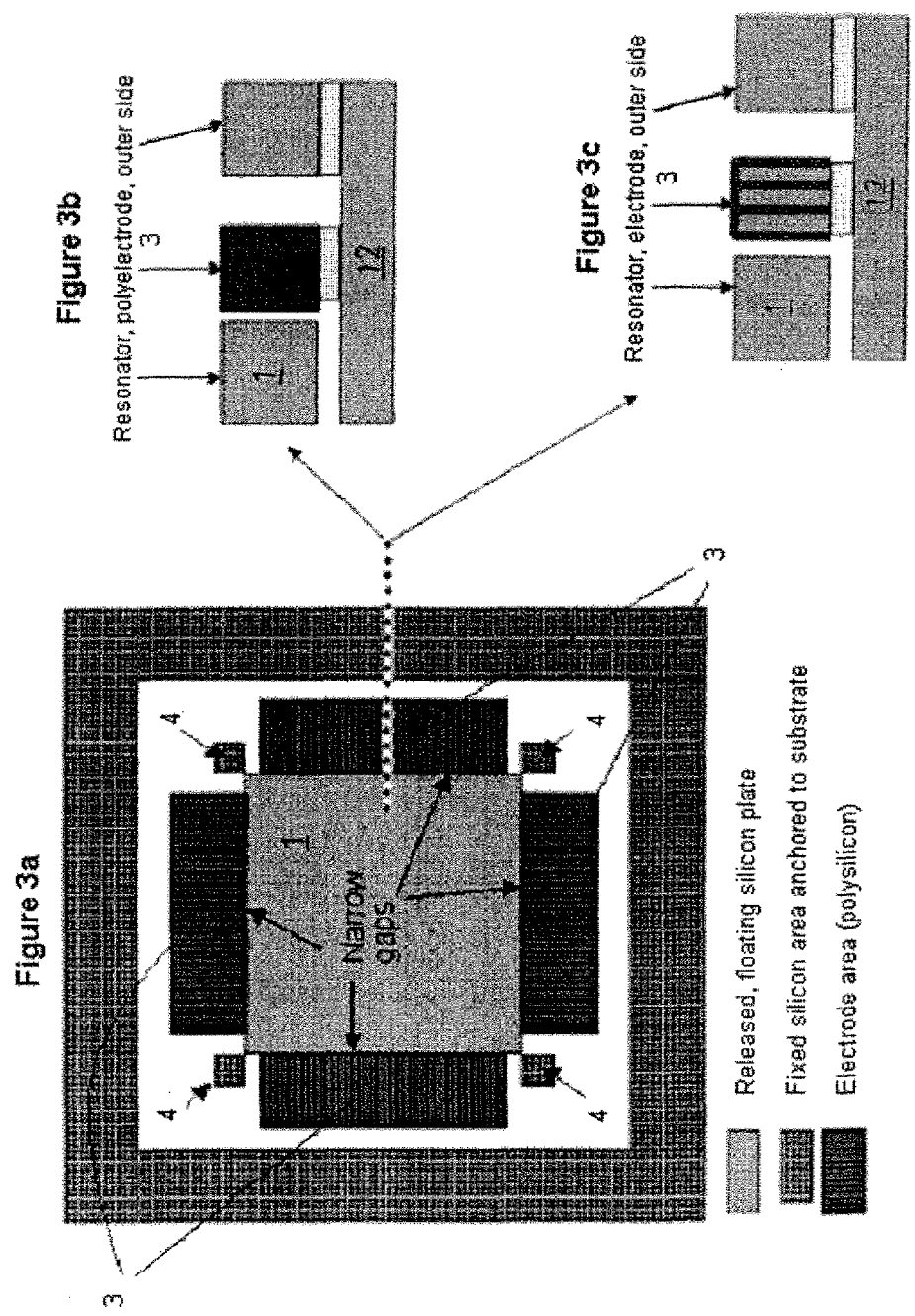

In the flat resonator according to a preferred embodiment of the invention, shown in FIG. 3, a fixed silicon area is anchored to the substrate 12, with the aid of anchors 4. In the structure of the flat resonator, there is a similar 'floating' silicon plate 1 to that in the acceleration sensor shown in FIG. 1. The cross-sectional alternatives show electrode structures according to preferred embodiments of the invention, of which one is unified (FIG. 3b) and in another there are thin protrusions (FIG. 3c). In both alternatives, the resonator 1 is separated from the electrode structure 3 by only a narrow gap 6.

The term 'SOI', used in connection with the invention, refers to silicon on top of an insulating material (silicon-on-insulator). SOI substrates, i.e. SOI wafers, are used particularly in the manufacture of small structures requiring great precision, in which they act as an electrically insulating base material. The greatest area of application for SOI wafers are high-speed, tightly integrated circuits. In these, the SOI structural layers used are thin (hundreds of nanometers), whereas in micromechanics there are several or tens of micrometers.

'Polysilicon' is multi-crystalline silicon. In connection with the present invention, it is used mainly as an electrode material. In the method according to the invention, a second material that is much used is single-crystal silicon, which is a mechanically stable material, whereby it is highly suitable for purposes according to the present invention. Both polysilicon and single-crystal silicon are widely used in the manufacture of micromechanical devices.

According to one preferred embodiment of the present invention, a silicon-micromechanical structure is manufactured from thin SOI-wafer structures, in which grooves are etched (FIG. 2, Stages 1-2). The thickness of the wafer is about 5-150 µm, preferably about 20 µm. Thermal oxidation is used to grow a thin oxide membrane on the walls of the grooves (Stage 3), which when etched in a later stage acts as a sacrificing layer and the thickness of which determines the width of the capacitive gap in the final structure. The thickness of the membrane can vary, but it is generally 50 nm, or thinner/thicker, for example, 10-200 nm. After this, the grooves are filled with a thick layer of electrode material (Stage 4), which layer covers all the other material.

After the growing of the electrode material, the surface remains uneven, because it conforms to the original shape of the structure. The surface must therefore be evened. Evening is performed in the preferred embodiments of the invention by first of all rough mechanical grinding and then by chemo-mechanical polishing (CMP) (Stage 5). After polishing, the surface is smooth and its height has returned to the original level, whereby among other things the oxide layer to be used as the sacrificing layer appears from beneath the electrode material (polysilicon).

After the surface has been evened, narrow or small holes are formed through the structural layer, which holes facilitate the etching solution used later in the release etching to penetrate to the various parts of the structure, and structural patterns are formed in the single-crystal structural silicon (Stage 6). The diameters of the release holes are about 1-10 µm, preferably about 4 µm.

The final structure is created by etching (Stage 7), in which an HF solution (hydrofluoric acid solution) is used as the etching solution, whereby the structures that are intended to move are released and, among other things, the thin silicon-oxide film between the electrodes and the moving parts is removed. A very narrow capacitive gap remains in place of the said oxide film.

According to a second preferred embodiment of the present invention, the SOI wafer used for the manufacture of the silicon-micromechanical structures is first of all etched with a recess 10, in which grooves are then etched, of which grooves some 11 are longitudinal relative to the direction of viewing FIG. 1d and the others 13 are transverse relative to the direction of viewing FIG. 1d. In this preferred embodiment, the transverse grooves 13 form a comb-like structure, which comprises at least two, preferably 3-4, protrusions 9 of single-crystal silicon. Due to the recess 10, the height of this structure is about 1-2 µm, preferably about 1 µm, lower than the height of the structure surrounding it. Thermic oxidation is used to grow an oxide film of the walls of the silicon-finger-comb structure, which when etched in a later stage acts as a sacrificing layer. After this, the grooves between the silicon protrusions 9 are filled with a thick layer of electrode material 14 (polysilicon), which layer covers all other material. Typically there are the same number of polysilicon protrusions 8 as there are of single-crystal silicon protrusions 9 (see FIG. 1a). On their side, there can also be 1 or 2 fewer polysilicon protrusions 8 than single-crystal silicon protrusions 9. As the electrode material 14 fills not only the grooves, but also the recess 10 previously etched into the wafer, the polysilicon fingers 8 of the electrodes remain in contact with each other, even after the evening of the surface, in which case the heights of the other structures are returned to their original level, revealing the oxide layer grown on top of them (FIG. 2, stage 5). Also according to this embodiment, the evening of the surface is achieved by grinding and polishing, as a result of which an even and smooth surface is obtained, which remains even and smooth in the end product (FIG. 2, Stage 7).

By means of this second preferred embodiment, comb-like electrode structures 3 are obtained, which create a larger capacitor surface area and a larger total capacitance between the moving structures 1 and the fixed body 12. The narrow gaps permit the use of a lower operating voltage when the micromechanical component is controlled electrostatically.

Polysilicon, e.g., LPCVD polysilicon, preferably epipoly-silicon grown in an epireactor, can be used as the electrode material. Single-crystal silicon is preferably used in the moving parts 1. The electrodes 3 are fixed and are separated from the fixed structural silicon by only the aforementioned narrow gap 6.

The silicon protrusions 8 in the electrode structure according to the aforementioned second embodiment (FIG. 2) form a comb-like structure in the longitudinal direction. Due to the recess 10 previously made in the SOI wafer structure, the protrusions 8 in the electrode structure are connected by a unified electrode structure about 1-2-µm thick, which fills the recess that was previously in this place. The polysilicon protrusions 8 in question reinforce the structure and prevent the outermost parts of the electrode structure 3 from wobbling, even though the solution used in the release etching has been partly able to penetrate even under and behind the polysilicon layer.

The widths ($W_{<Si>}$) of the single-crystal silicon protrusions 9 are at least a few micros, preferably about 5 µm while the grooves that separate them, from which the polysilicon protrusions 8 are formed, are about 4 µm wide and at right-angles relative to the surface of the wafer. The total width ($W_{poly}$) of the entire electrode structure 3 can be calculated according to the following equation, $$W_{poly} = n*4 + (n-1)*5$$

in which n is the number of narrow grooves filled with polysilicon (e.g., in FIG. 2, n=3) while the number 4 corresponds to the width of the grooves in question. For example, if the number of grooves is 3 (i.e. n=3), as in FIG. 2, the width of the entire comb-like structure, i.e. the electrode structure 3, can, with the aid of the equation, be calculated to be about 27 µm. By varying the widths of the single-crystal protrusions 9 and the grooves between them, electrode structures 3 with a total width of about 20-35 µm can be formed (when n=3).

In order to release the single-crystal silicon from the base material, i.e. the SOI wafer, the preferred embodiments according to the present invention include the etching of release holes 7 in the single-crystal silicon prior to the final HF etching, which is performed in order to release the structures. With the aid of the release holes 7, the etching solution will be able to act under even large areas of single-crystal silicon.

The maximum height of the silicon protrusions is determined by the fact that the said release holes 7 in the single-crystal silicon must be made through the structural layer. By making larger holes, it is possible to use a thicker structural layer. The ratio (aspect ratio, max AR) of the thickness of the structural layer to the widths of the holes is 10:1, i.e. if the diameter of the hole is about 4 µm, a structural layer with a thickness of 40 µm can be used. AR is to some extent a device-specific number.

If the aforementioned release holes are not needed, the maximum height of the silicon protrusions is determined by the etching and filling of the grooves in the comb-like structure. If the estimated max AR of the grooves is 25:1 and the thickness of the filler layer is 2 µm, the greatest possible groove depth will be about 100 µm, calculated according to the following equation:

$$height = (2+2)*maxAR$$

The width of the aforementioned grooves is determined by only the thermic oxidation, by means of which the etched oxide film is later formed on the walls of these grooves.

As can be seen from FIG. 1, each single-crystal silicon protrusion 9 forms a pair with one polysilicon protrusion 8. These pairs 8, 9 form said comb-like structure. In FIG. 1a, there are four of these pairs at each electrode 3. The total capacitance ($C_{tot}$) of the electrode structure according to the figure in question would thus be four times greater than the capacitance ($C_1$) of a structure with only one pair of protrusions 8, 9. The total capacitance is thus directly proportional to the number (n) of protrusions pairs 8, 9.

$$C_{tot} = n*C_1$$

The method according to the present invention and the structures or components manufactured with the aid of the method can be used in many different ways. Typical end products for the process according to the invention are silicon-micromechanical structures. Such are, for example, silicon-micromechanical flat resonators, which are used as oscillating circuits in electronic resonators, in other words as replacement for quartz crystals. Alternatively, the invention can be applied, for example, to the manufacture of acceleration sensors.

Structures or components manufactured according to the invention can be used in various wafer-bonding applications, in which by using the invention it is possible to create, for example, structures suitable for vacuum sealing or packaging, since the surface evened by grinding and chemo-mechanical polishing is much more even than a surface evened by etching, whereby air or dirt and other particles cannot enter these vacuum-sealed structures or packages.

The method according to the present invention also permits the manufacture of micromechanical components and their use in applications, in which a large capacitance is required between the electrodes. Capacitive micromechanical sensors are widely used, for instance, in the automotive industry. The strengths of microsensors include a low power consumption and integrability in electronics. They are completely suitable, for example, for precision measurements. An acceleration sensor manufactured according to the invention can be used, for example, in automobiles, to measure acceleration, or in various industrial equipment, to measure the level of vibration.

The invention claimed is:

1. Silicon-micromechanical structure, which comprises
a body,
a mass attached flexibly to the body
a capacitor structure formed between the body and the mass, wherein
the micromechanical structure has a smooth surface, and protrusions corresponding to each other and facing each other are formed in both the mass and the body, so that the micromechanical structure includes a narrow capacitive gap, formed using a thermally oxidized sacrificial layer, in order to create the greatest possible capacitive density.

2. Structure according to claim 1, wherein
in the micromechanical structure there is a moving structure made from single-crystal silicon, which floats supported on four anchors, to which it is attached with the aid of suspension springs,
a groove runs around the moving structure, and ensures the movability of the structure, and extra holes run through the structure, for release etching,
the narrow capacitive gap is etched between the single-crystal silicon and electrode structures, and
in the single-crystal silicon there are at least two protrusions and a corresponding number of electrode protrusions are set opposite to them.

3. Silicon-micromechanical structure according to claim 1 or 2, wherein an electrode material is epipolysilicon.

4. Silicon-micromechanical structure according to claim 1, wherein a moving structure of said micromechanical structure is formed of single-crystal silicon.

5. Silicon-micromechanical structure according to claim 1, wherein some of said protrusions
are in an electrode structure, and
are about 4 μm wide.

6. Silicon-micromechanical structure according to claim 1, wherein some of said protrusions are in an electrode structure and form a comb-like structure.

7. Silicon-micromechanical structure according to claim 1, wherein some of said protrusions form a comb-like polysilicon structure and reinforce the structure and prevent its outermost parts from wobbling.

8. Silicon-micromechanical structure according to claim 1, wherein, due to a recess in the SOI-wafer structure, some of said protrusions which form a comb-like electrode structure are connected by a unified silicon mass about 1 μm thick.

9. Silicon-micromechanical structure according to claim 1, wherein some of the protrusions are of single-crystal silicon, and the widths of the protrusions of single-crystal silicon are about 5 μm.

10. Silicon-micromechanical structure according to claim 1, wherein the width of an entire electrode structure in said micromechanical structure is about 20-35 μm.

11. Silicon-micromechanical structure according to claim 1, wherein the micromechanical structure is a resonator.

12. Silicon-micromechanical structure according to claim 1, wherein the micromechanical structure is an acceleration sensor.

13. Use of the silicon-micromechanical structure according to claim 1 in applications, in which a large capacitance is required between the electrodes, said micromechanical structure being used as a component in said applications.

* * * * *